US009432049B2

(12) United States Patent
Katayama et al.

(10) Patent No.: US 9,432,049 B2
(45) Date of Patent: Aug. 30, 2016

(54) INCREMENTAL DELTA-SIGMA A/D MODULATOR AND A/D CONVERTER

(71) Applicant: ASAHI KASEI MICRODEVICES CORPORATION, Tokyo (JP)

(72) Inventors: Takato Katayama, Tokyo (JP); Yuichi Miyahara, Tokyo (JP); Kanya Sasaki, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/982,484

(22) Filed: Dec. 29, 2015

(65) Prior Publication Data

US 2016/0197619 A1    Jul. 7, 2016

(30) Foreign Application Priority Data

Jan. 7, 2015   (JP) .................. 2015-001426
Nov. 4, 2015   (JP) .................. 2015-216669

(51) Int. Cl.
*H03M 3/00*   (2006.01)
*H03M 1/12*   (2006.01)

(52) U.S. Cl.
CPC ............. *H03M 3/32* (2013.01); *H03M 1/12* (2013.01); *H03M 3/30* (2013.01); *H03M 3/422* (2013.01); *H03M 3/464* (2013.01)

(58) Field of Classification Search
CPC ...... H03M 3/32; H03M 3/422; H03M 3/464; H03M 3/30; H03M 1/12
USPC ............................................... 341/143, 155
See application file for complete search history.

(56) References Cited

U.S. PATENT DOCUMENTS

| 5,410,310 | A  | * | 4/1995  | Molnar .................. | H03M 3/46 341/131 |
| 7,446,686 | B2 | * | 11/2008 | Rueger .................. | H03M 3/39 341/143 |
| 7,903,010 | B1 | * | 3/2011  | Melanson ............. | H03M 3/474 341/143 |
| 2014/0077985 | A1 | | 3/2014 | Tokunaga | |

FOREIGN PATENT DOCUMENTS

| JP | 2011-171882 A  | 9/2011 |
| WO | 2013/136676 A1 | 9/2013 |

* cited by examiner

*Primary Examiner* — Brian Young
(74) *Attorney, Agent, or Firm* — Morgan, Lewis & Bockius LLP

(57) ABSTRACT

An A/D converter includes an incremental delta-sigma A/D modulator and a digital operation unit to which a signal from the A/D modulator is input. The A/D modulator includes an analog integrator configured to integrate input signals, a quantizer configured to quantize output signals of the analog integrator, a D/A converter configured to D/A convert an output of the quantizer, and a reset signal output device configured to reset the analog integrator and the digital operation unit. The analog integrator includes plural switched capacitors and a first analog integrator connected to the switched capacitors. The first analog integrator includes an operational amplifier connected to the switched capacitors and a feedback capacitor each connecting an input and an output of the operational amplifier.

10 Claims, 10 Drawing Sheets

INCREMENTAL DELTA-SIGMA A/D MODULATOR AND A/D CONVERTER

TECHNICAL FIELD

The present invention relates to an incremental delta-sigma A/D modulator and an A/D converter.

BACKGROUND ART

Conventionally, an A/D (analog/digital) converter converting an analog signal to a digital signal is used in various apparatuses. In general, the A/D converter requires high precision and low power consumption. An example of an A/D converter that achieves both high precision and low power consumption is an incremental delta-sigma A/D converter.

FIG. 1 is a block diagram illustrating an incremental delta-sigma A/D converter of Patent Literature (PTL) 1. The incremental delta-sigma A/D converter includes a sample hold (SH) circuit 1, a reset signal generator 2, a delta-sigma modulator 3, and a digital operation unit 4. The delta-sigma modulator 3 includes an analog integrator 12 having L (>=1) stages, a quantizer 13, a D/A converter (DAC) 14, and an adder 11. The reset signal generator 2 is configured to reset the analog integrator 12 and a digital integrator (not illustrated in the drawing) of the digital operation unit 4 before converting an analog signal to a digital signal. The incremental delta-sigma A/D converter is different from an ordinary delta-sigma A/D converter in that it is characterized by including the reset signal generator 2.

CITATION LIST

Patent Literature

PTL 1: WO 2013/136676

SUMMARY OF INVENTION

Technical Problem

However, the incremental delta-sigma A/D converter of PTL 1 includes the sample hold circuit 1 outside a loop of the delta-sigma modulator 3. Since the sample hold circuit 1 is located outside the loop of the delta-sigma modulator 3, a noise that occurs in the sample hold circuit 1 can directly be superimposed on an input signal of the delta-sigma modulator 3. Due to this, the sample hold circuit 1 requires low noise. However, when the sample hold circuit 1 has low noise, there is a problem in that power consumption increases.

The present invention has been accomplished in view of such a problem. It is an object of the invention to provide an incremental delta-sigma A/D modulator and an A/D converter that have low noise and low power consumption.

Solution to Problem

According to a first aspect of the present invention, there is provided an incremental delta-sigma A/D modulator comprising: an analog integrator configured to integrate input signals; a quantizer configured to quantize output signals of the analog integrator; a D/A converter configured to D/A convert based on an output of the quantizer; and a reset signal output device configured to output a reset signal for resetting the analog integrator. The incremental delta-sigma A/D modulator operating at a predetermined oversampling ratio. The analog integrator includes a first plurality of switched capacitors, an operational amplifier connected to the first plurality of switched capacitors, and a feedback capacitor connecting an input and an output of the operational amplifier. Respective identical signals are input to respective corresponding switched capacitors of the first plurality of switched capacitors.

According to a second aspect of the present invention, there is provided an A/D converter including the incremental delta-sigma A/D modulator of the first aspect described above and a digital operation unit to which an output signal of the incremental delta-sigma A/D modulator is input, in which the digital operation unit includes a digital amplifier configured to amplify the input signal.

In addition, the above-described aspects of the present invention do not describe all necessary characteristic structures of the invention. Thus, the invention can also be formed in combination with other structures.

Advantageous Effects of Invention

According to the present invention, it is possible to provide an incremental delta-sigma A/D modulator and an A/D converter that have low noise and low power consumption.

DESCRIPTION OF EMBODIMENTS

The following detailed description will describe many particular specific structures to provide complete understanding of embodiments of the present invention. However, it will be obvious that, without being limited to such particular specific structures, other embodiments can be implemented. In addition, the embodiments described below do not limit the invention according to the claims and include all of combinations of characteristic structures described in the embodiments.

Hereinafter, each embodiment of the present invention will be described with reference to the drawings.

First Embodiment

Figure 1:
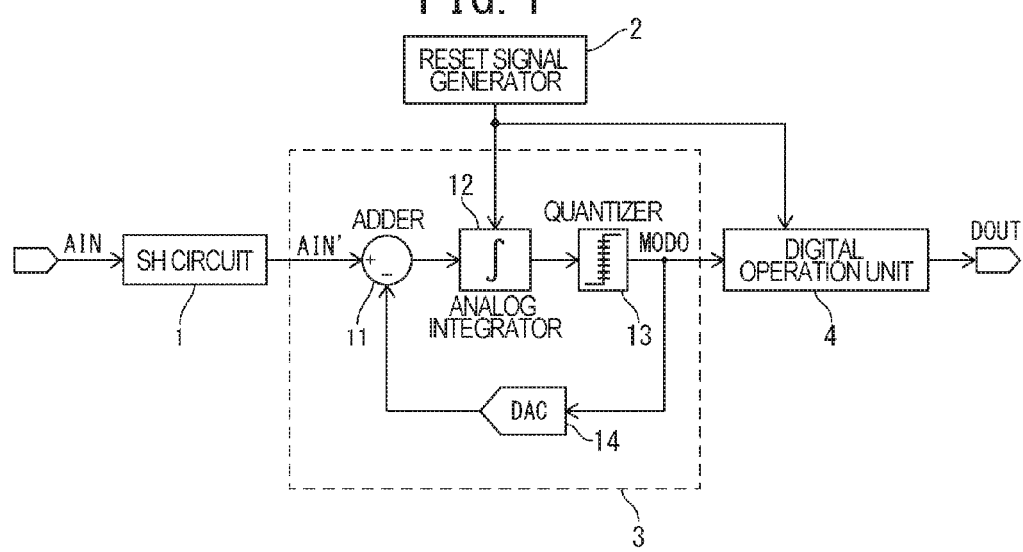
FIG. 1 is a block diagram illustrating a conventional incremental delta-sigma A/D converter.
Figure 2:
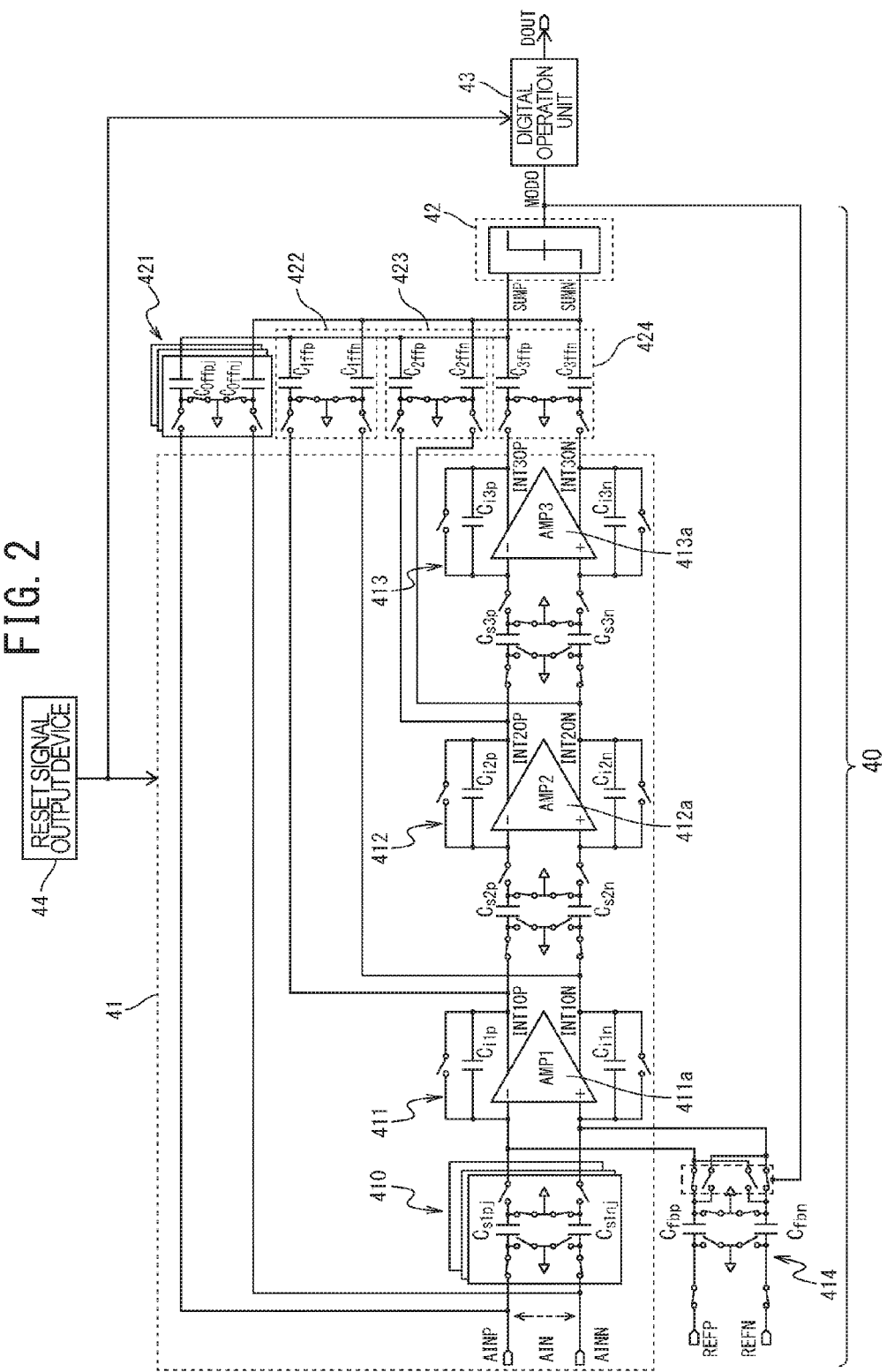
FIG. 2 is a circuit structure diagram illustrating an A/D converter according to a first embodiment of the present invention.

FIG. 2 is a circuit structure diagram illustrating an A/D converter according to a first embodiment of the present invention.

The A/D converter of the first embodiment includes an incremental delta-sigma A/D modulator 40 and a digital operation unit 43 to which a signal from the incremental delta-sigma A/D modulator 40 is input. The incremental delta-sigma A/D modulator 40 includes an analog integrator 41 configured to integrate an input signal, a quantizer 42 configured to quantize an output signal of the analog integrator 41, a D/A converter 414 configured to D/A convert an output of the quantizer 42, and a reset signal output device 44 configured to output a reset signal for resetting the analog integrator 41 and the digital operation unit 43.

The incremental delta-sigma A/D modulator 40 is configured to convert an input analog signal to a serial digital code at each conversion cycle. The number of digital codes (codes represented by 0 or 1) included in the serial digital code is the same as an oversampling ratio of the incremental delta-sigma A/D modulator 40. For example, when the oversampling ratio of the incremental delta-sigma A/D modulator 40 is 60, the incremental delta-sigma A/D modulator 40 converts an input analog signal to a serial digital code including 60 digital codes. The incremental delta-sigma A/D modulator 40 is configured to output one digital code at each oversampling.

The analog integrator 41 includes a first plurality of switched capacitors 410 and a first analog integrator 411 connected to the first plurality of switched capacitors 410. The first analog integrator 411 includes an operational amplifier 411a whose input is connected to the first plurality of switched capacitors 410 and feedback capacitors $Ci1p$ and $Ci1n$ each connecting the input and an output of the operational amplifier 411a.

The analog integrator 41 of the first embodiment is a three-stage analog integrator. The analog integrator 41 further includes switched capacitors $Cs2p$ and $Cs2n$ connected to outputs of the first analog integrator 411, a second analog integrator 412 connected to the switched capacitors $Cs2p$ and $Cs2n$, switched capacitors $Cs3p$ and $Cs3n$ connected to outputs of the second analog integrator 412, and a third analog integrator 413 connected to the switched capacitors $Cs3p$ and $Cs3n$.

The second analog integrator 412 includes an operational amplifier 412a connected to switched capacitors $Cs2p$ and $Cs2n$ and feedback capacitors $Ci2p$ and $Ci2n$ each connecting an input and an output of the operational amplifier 412a.

The third analog integrator 413 includes an operational amplifier 413a connected to switched capacitors $Cs3p$ and $Cs3n$ and feedback capacitors $Ci3p$ and $Ci3n$ each connecting an input and an output of the operational amplifier 413a.

Although the analog integrator 41 of the A/D converter of the first embodiment is the three-stage analog integrator, the number of stages of the analog integrator 41 is not particularly limited.

The D/A converter 414 is, for example, a switched capacitor D/A converter and includes capacitors Cfbp and Cfbn. The D/A converter 414 connects a reference voltage REFP and the capacitor Cfbp to store an electric charge corresponding to the reference voltage REFP in the capacitor Cfbp. In addition, the D/A converter 414 connects a reference voltage REFN and the capacitor Cfbn to store an electric charge corresponding to the reference voltage REFN in the capacitor Cfbn. The reference voltage REFN is a reference voltage having a polarity opposite to that of the reference voltage REFP.

Then, based on an output of the quantizer 42, the D/A converter 414 is configured to determine whether to connect the capacitor Cfbp to an inverting input or a non-inverting input of the operational amplifier 411a. When the capacitor Cfbp is connected to the inverting input of the operational amplifier 411a, the capacitor Cfbn is connected to the non-inverting input thereof. When the capacitor Cfbp is connected to the non-inverting input of the operational amplifier 411a, the capacitor Cfbn is connected to the inverting input thereof.

The incremental delta-sigma A/D modulator 40 includes a first plurality of feedforward switched capacitors 421 for inputting inputs AINP and AINN of the incremental delta-sigma A/D modulator 40 to the quantizer 42.

Additionally, the incremental delta-sigma A/D modulator 40 includes a second plurality of feedforward switched capacitors 422 for inputting an output of the operational amplifier 411a to the quantizer 42, a third plurality of feedforward switched capacitors 423 for inputting an output of the operational amplifier 412a to the quantizer 42, and a fourth plurality of feedforward switched capacitors 424 for inputting an output of the operational amplifier 413a to the quantizer 42.

The first plurality of t feedforward switched capacitors 421 includes a capacitor C0ffp to which the AINP is input and a capacitor C0ffn to which the AINN is input. The capacitor C0ffp includes m capacitors C0ffp1 to C0ffpm to which the AINP is input, and the capacitor C0*ffn* includes m capacitors C0ffn1 to C0ffnm to which the AINN is input.

The number m of capacitor divisions represents an integer and is the same value as an oversampling ratio of the incremental delta-sigma A/D modulator 40.

The second plurality of feedforward switched capacitors 422 includes a capacitor C1ffp to which a non-inverting output of the operational amplifier 411a is input and a capacitor C1ffn to which an inverting output of the operational amplifier 411a is input.

The third plurality of feedforward switched capacitors 423 includes a capacitor C2ffp to which a non-inverting output of the operational amplifier 412a is input and a capacitor C2ffn to which an inverting output of the operational amplifier 412a is input.

The fourth plurality of feed forward switched capacitors 424 includes a capacitor C3ffp to which a non-inverting output of the operational amplifier 413a is input and a capacitor C3ffn to which an inverting output of the operational amplifier 413a is input.

The digital operation unit 43 includes a digital integrator configured to integrate an output MODO of the quantizer 42 to output a digital output DOUT. The order of the digital integrator is preferably the same as the number of stages of the analog integrator 41.

Figure 3:
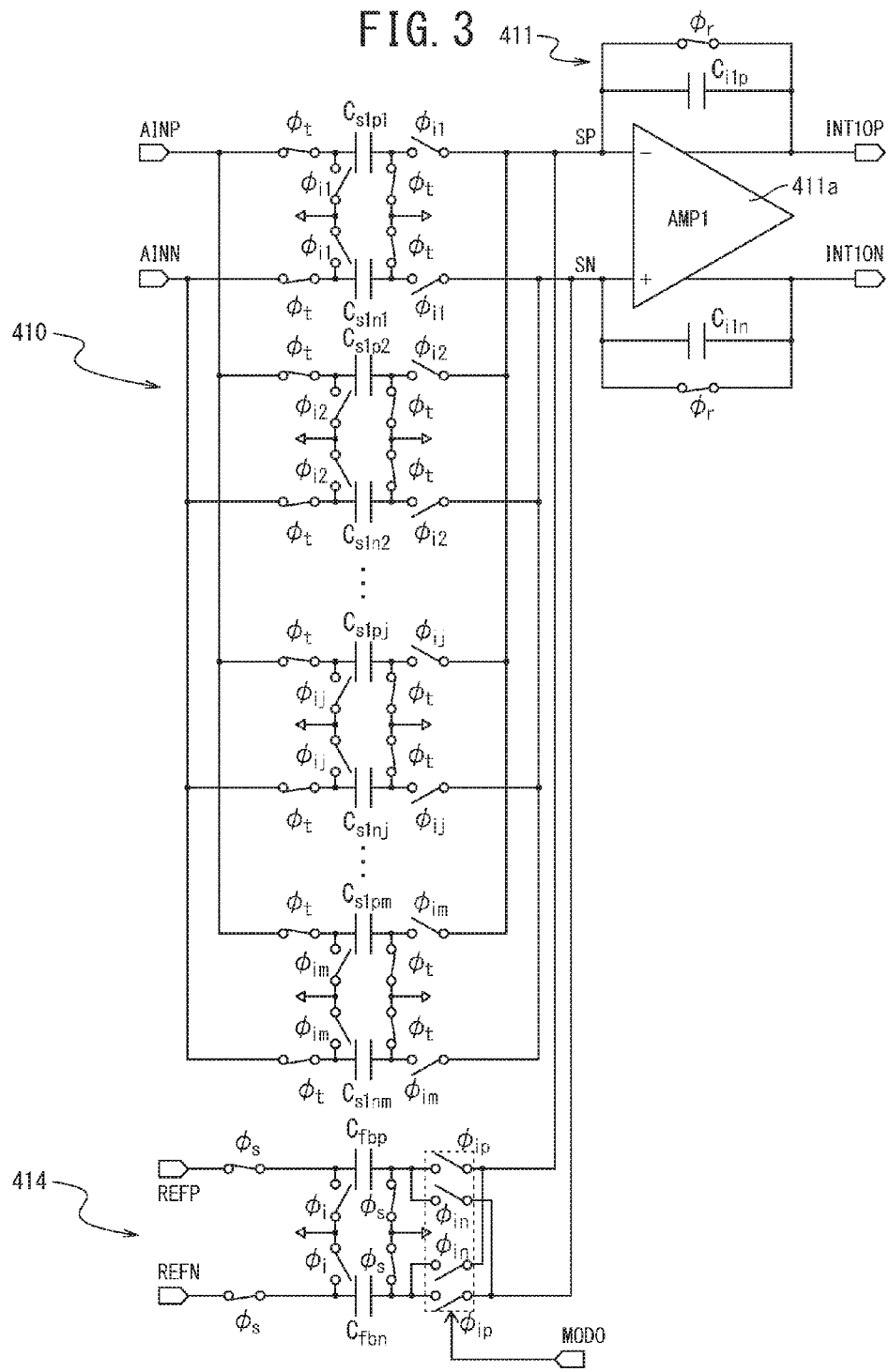
FIG. 3 is a diagram illustrating a first plurality of switched capacitors of the A/D converter of the first embodiment.

FIG. 3 is a diagram illustrating the first plurality of switched capacitors of the A/D converter according to the first embodiment of the present invention.

The first plurality of switched capacitors 410 includes m capacitors to which the AINP is input. In other words, the first plurality of switched capacitors 410 includes capacitors Cs1p1 to Cs1pm to which the AINP is input. In addition, the first plurality of switched capacitors 410 includes m capacitors to which the AINN is input. In other words, the first plurality of switched capacitors 410 includes capacitors Cs1n1 to Cs1nm to which the AINN is input.

The first plurality of switched capacitors 410 store electric charges according to the input signals AINP and AINN at one time in the capacitors Cs1p1 to Cs1pm and Cs1n1 to Cs1nm. The AINN represents a signal having a polarity opposite to that of the AINP.

The first plurality of switched capacitors 410 are configured to transfer all of the electric charges stored in the capacitors Cs1p1 to Cs1pm to the feedback capacitor Culp. The electric charges stored in the capacitors Cs1p1 to Cs1pm may be transferred at one time to the feedback capacitor Ci1p.

However, when the electric charges stored in the capacitors Cs1p1 to Cs1pm are transferred at one time to the feedback capacitor Ci1p, the output of the third analog integrator 413 can be saturated. From the viewpoint of prevention of saturation, the electric charges stored in the capacitors Cs1p1 to Cs1pm are preferably transferred sequentially to the feedback capacitor Ci1p at each oversampling of the incremental delta-sigma A/D modulator 40.

In addition, the sequential transfer of the electric charges stored in the capacitors Cs1p1 to Cs1pm to the feedback capacitor Ci1p at each oversampling of the incremental delta-sigma A/D modulator 40 allows the output of the third analog integrator 413 to be hardly saturated when a gain of each analog integrator is made large. Making the gain of each analog integrator large can reduce quantization noise. The gain of the second analog integrator 412 can be made large by making Cs2P/Ci2p and Cs2n/Ci2n large. The gain of the third analog integrator 413 can be made large by making Cs3p/Ci3p and Cs3n/Ci3n large.

Similarly, the first plurality of switched capacitors 410 may be configured to transfer the electric charges stored in the capacitors Cs1n1 to Cs1nm at one time to the feedback capacitor Ci1n. However, from the viewpoint of saturation of the output of the analog integrator and the viewpoint of reduction of quantization noise, preferably, the electric charges stored in the capacitors Cs1n1 to Cs1nm are sequentially transferred to the feedback capacitor Ci1n at each oversampling of the incremental delta-sigma A/D modulator 40.

As described above, the A/D converter of the present first embodiment has the circuit structure in which the sample hold circuit is incorporated in the analog integrator of the incremental delta-sigma A/D modulator. It is thus unnecessary to provide a sample hold circuit outside the loop of the incremental delta-sigma A/D modulator. Thereby, there can be obtained an incremental delta-sigma A/D modulator having low noise and low power consumption.

Next, a description will be given of operation timing of the A/D converter of the first embodiment.

Figure 4:
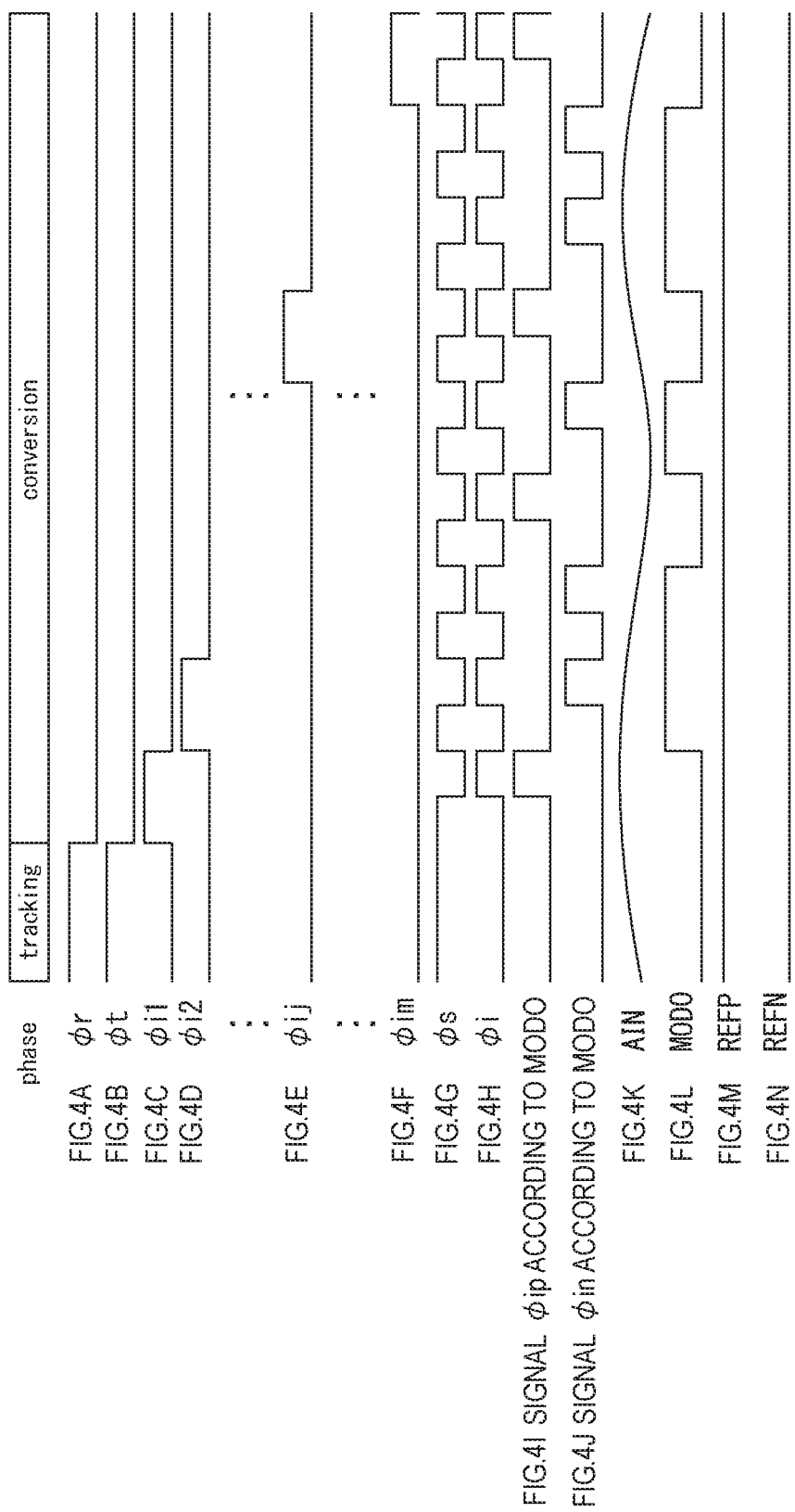
FIGS. 4A to 4N are signal waveform charts of the circuit illustrated in FIG. 2.

FIGS. 4A to 4N are signal waveform charts of the circuit illustrated in FIG. 2.

In an input signal tracking phase, the first plurality of switched capacitors store electric charges at one time in the capacitors Cs1p1 to Cs1pm, and Cs1n1 to Cs1nm at a timing where $\phi t$ is at H level.

Then, in a conversion phase, the first plurality of switched capacitors transfer the electric charges of the capacitors Cs1p1 and Cs1n1 to the feedback capacitors Ci1p and Ci1n at a timing where $\phi i1$ is at H level.

Similarly, the first plurality of switched capacitors transfer the electric charges of the jth capacitors Cs1pj and Cs1nj to the feedback capacitors Ci1p and Ci1n at a timing where $\phi ij$ is at H level.

The number m of capacitor divisions is the same as the value of the oversampling ratio of the incremental delta-sigma A/D modulator 40. The first plurality of switched capacitors sequentially transfer the electric charges to the feedback capacitors at each oversampling of the incremental delta-sigma A/D modulator 40, and when the first plurality of switched capacitors transfers the electric charges m times, the transfer of the electric charges stored in the tracking phase is completed.

The D/A converter 414 is configured to store electric charges corresponding to the reference voltage REFP and the reference voltage REFN in the capacitors Cfbp and Cfbn at timing of rising of $\phi s$, and to transfer the electric discharges stored in the capacitors Cfbp and Cfbn to the feedback capacitors Ci1$p$ and Ci1$n$ at timing of rising of $\phi i$. The D/A converter 414 is configured to determine which the capacitors Cfbp and Cfbn are connected to, based on the output of the quantizer 42.

The electric charges of the capacitors Cs2p and Cs2n and the electric charges of the capacitors Cs3$p$ and Cs3n, respectively, are transferred to the capacitors Ci2p and Ci2n and the capacitors Ci3p and Ci3n, respectively, at the rising of $\phi i$.

The first plurality of feedforward switched capacitors 421 are configured to transfer electric charges corresponding to an AINP signal and an AINN signal stored in the capacitors C0ffp and C0ffn to the quantizer 42 at the timing of $\phi i$.

The second plurality of feedforward switched capacitors 422 are configured to transfer electric charges according to the output of the first analog integrator 411, stored in the C1ffp and the C1$ffn$, to the quantizer 42 at the timing of $\phi i$.

The third plurality of feedforward switched capacitors 423 are configured to transfer the electric charges according to the output of the second analog integrator 412, stored in the C2ffp and the C2ffn, to the quantizer 42 at the timing of $\phi i$.

The fourth plurality of feedforward switched capacitors 424 are configured to transfer the electric charges according to the output of the third analog integrator 413, stored in the C3ffp and the C3ffn, to the quantizer 42 at the timing of $\phi i$.

The first to the fourth feedforward switched capacitors are configured to reset the electric charges stored in the C0ffp, C0ffn, C1ffp, C1ffn, C2ffp, C2ffn, C3ffp, and C3ffn at timing of $\phi s$.

The reset signal output device 44 is configured to output a reset signal at a timing where $\phi r$ is at H level and to short-circuit the inputs and outputs of the operational amplifiers 411a to 413a to reset the analog integrator. Furthermore, the reset signal output device 44 is configured to reset the digital integrator included in the digital operation unit 43.

In addition, the first plurality of switched capacitors 410 may be separated from summing nodes SP and SN of the operational amplifier 411a after the first plurality of switched capacitors 410 transfer the electric charges stored in the capacitors Cs1p1 to Cs1pm and Cs1n1 to Cs1nm to the feedback capacitors.

As an alternative to that, after transferring the electric charges stored in the capacitors Cs1p1 to Cs1pj and Cs1n1 to Cs1nj (provided that j represents an integer of less than m) to the feedback capacitors, the first plurality of switched capacitors may be separated from the summing nodes SP and SN of the operational amplifier 411a.

In other words, before transferring the electric charges stored in the capacitors Cs1p1j+1 to Cs1pm and Cs1nj+1 to Cs1nm to the feedback capacitors, the capacitors Cs1p1 to Cs1pj and Cs1n1 to Cs1nj may be separated from the summing nodes SP and SN of the operational amplifier 411a. In addition, the capacitors may be separated therefrom by dividing the separation thereof into a plurality of times of separation.

Since such a structure reduces load on the operational amplifier 411a, the operational amplifier 411a has an improved feedback gain and an improved feedback band, thereby allowing reductions in current consumption and area.

Meanwhile, a noise may occur at the time of separation of an input capacitance from the summing nodes SP and SN of the AMP1. In the incremental delta-sigma A/D converter, the smaller the number of times of conversion (the smaller the "j"), the larger the weight and the larger the noise that appears. However, when the input capacitance is separated from the summing nodes SP and SN of the amplifier later, the weight becomes smaller and a noise that appears in the output becomes smaller. Thus, noise reduction can be made by separating the input capacitance not immediately but at optional timing.

Second Embodiment

Figure 5:
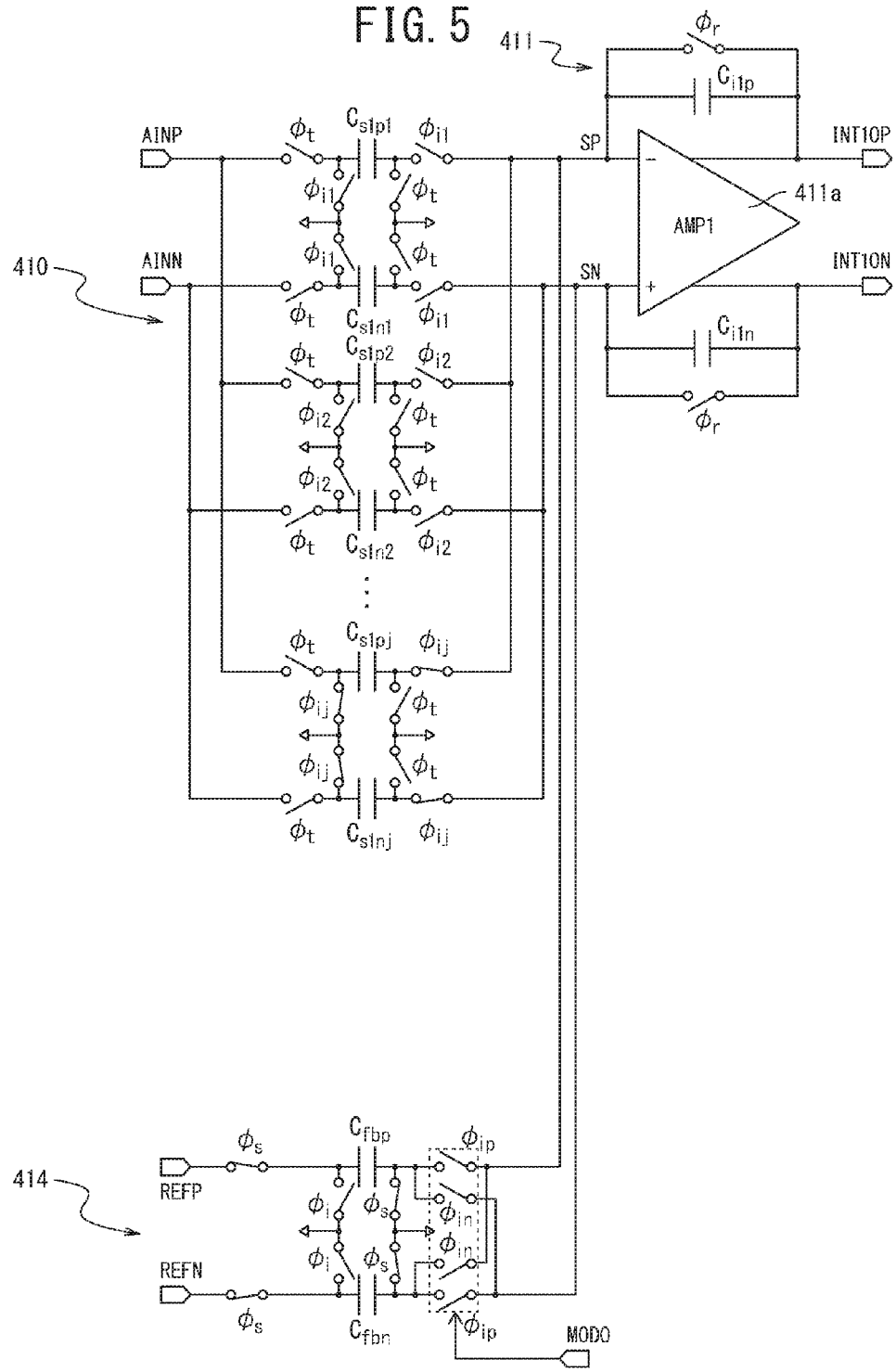
FIG. 5 is a circuit structure diagram illustrating an A/D converter according to a second embodiment of the invention.
Figure 6:
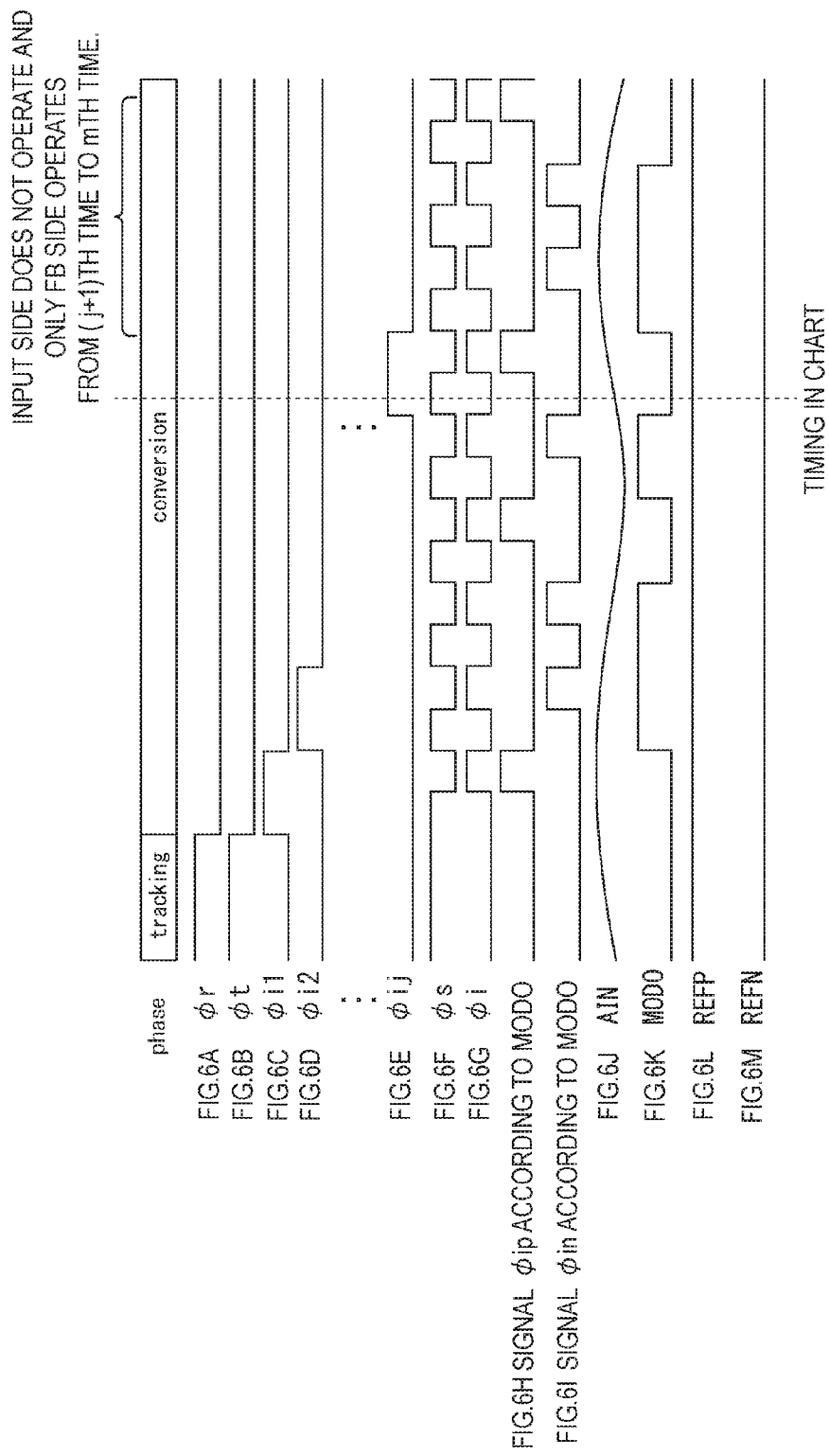
FIGS. 6A to 6M are signal waveform charts of the circuit illustrated in FIG. 5.

FIG. 5 is a circuit structure diagram illustrating an A/D converter according to a second embodiment of the present invention.

The A/D converter of the present second embodiment is, as compared to the A/D converter of the first embodiment, different in terms of the number of the switched capacitors included in the first plurality of switched capacitors 410, and structures thereof other than that are the same as those of the A/D converter of the first embodiment.

The first plurality of switched capacitors 410 includes j capacitors to which the AINP is input. In other words, the first plurality of switched capacitors 410 includes capacitors Cs1p1 to Cs1pj to which the AINP is input. In addition, the first plurality of switched capacitors 410 includes j capacitors to which the AINN is input. In other words, the first plurality of switched capacitors 410 includes capacitors Cs1n1 to Cs1nj to which the AINN is input.

The number j of capacitor divisions represents an integer and is smaller than a value m of the oversampling ratio of the incremental delta-sigma A/D modulator 40.

Next, a description will be given of operation timing of the first plurality of switched capacitors 410.

FIGS. 6A to 6M are signal waveform charts of the circuit illustrated in FIG. 5.

In an input signal tracking phase, the first plurality of switched capacitors 410 store electric charges at one time in the capacitors Cs1p1 to Cs1pj and Cs1n1 to Cs1nj at a timing where $\phi$t is at H level.

Then, in a conversion phase, the first plurality of switched capacitors 410 transfer the electric charges of the capacitors Cs1p1 and Cs1n1 to the feedback capacitors Ci1p and Ci1n at a timing where $\phi$i1 is at H level.

Similarly, the first plurality of switched capacitors 410 transfer the electric charges of the jth capacitors Cs1pj and Cs1nj to the feedback capacitors Ci1p and Ci1n at a timing where $\phi$ij is at H level.

In the conversion phase, the first plurality of switched capacitors transfer the electric charges stored in the capacitors Cs1p1 to Cs1pj and Cs1n1 to Cs1nj to the feedback capacitors from a first time to a jth time, but do not transfer the electric charges stored in the capacitors Cs1p1 to Cs1pj and Cs1n1 to Cs1nj to the feedback capacitors from a (j+1)th time to a mth time. In other words, the incremental delta-sigma A/D modulator 40 is configured to perform oversampling without transferring the electric charges to the feedback capacitors Ci1p and Ci1n from the (j+1)th to the mth times.

Since the incremental delta-sigma A/D modulator 40 is configured to reset the analog integrator 41 and the digital operation unit 43 before executing A/D conversion, the electric charges transferred from the first plurality of switched capacitors 410 to the feedback capacitors Ci1p and Ci1n immediately after the resetting greatly contribute to a digital output MODO of the quantizer 42. Then, as the electric charges are transferred later in time, the level of contribution thereof to the output MODO of the quantizer 42 becomes lower. For example, it is assumed that in the conversion phase, the first plurality of switched capacitors 410 transfer the electric charges stored in the capacitors Cs1p1 to Cs1pm to the feedback capacitors in a sequential order from the capacitor Cs1p1. In this case, the electric charge stored in the capacitor Cs1p1 has a higher level of contribution to the digital output MODO, and as the electric charge is one closer to the capacitor Cs1pm, the level of contribution thereof to the digital output MODO becomes lower.

The A/D converter of the second embodiment is characterized in that the A/D converter is configured to transfer the electric charges from the first to the jth times where the level of contribution thereof to the digital output MODO is high, and does not transfer the electric charges from the (j+1)th to the mth times where the level of contribution thereof to the digital output MODO is low. Since the transfer of the electric charges is stopped halfway, a time from the start of the conversion phase to the start of the next tracking phase can be shortened.

However, when the transfer thereof is stopped halfway, the gain of the output is reduced. Accordingly, preferably, the total gain is adjusted to 1 by providing a digital amplifier in the digital operation unit to perform gain correction or optionally changing the capacitance value of the Cs1p1 to Cs1pj and the Cs1n1 to Cs1nj.

Third Embodiment

Figure 7:
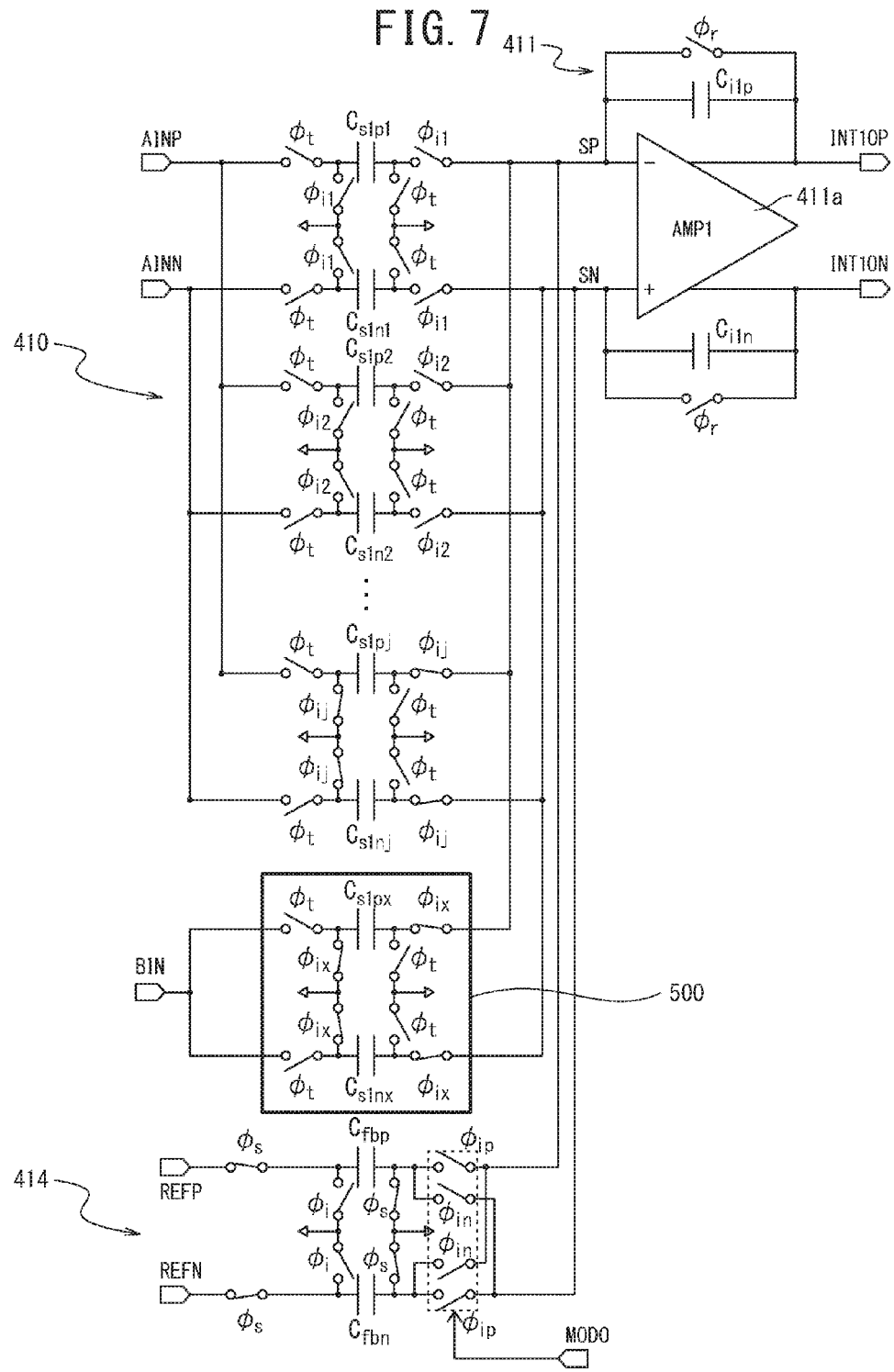
FIG. 7 is a circuit structure diagram illustrating an A/D converter according to a third embodiment of the invention.

FIG. 7 is a circuit structure diagram illustrating an A/D converter according to a third embodiment of the present invention.

The A/D converter of the third embodiment is, as compared to the A/D converter of the second embodiment, different in that the first plurality of switched capacitors 410 include a plurality of dummy switched capacitors 500. Structures thereof other than that are the same as those of the A/D converter of the second embodiment.

The plurality of dummy switched capacitors 500 include a switched capacitor having a capacitor Cs1px and a switched capacitor having a capacitor Cs1nx. An identical input signal BIN is input to the capacitors Cs1px and Cs1nx.

Next, a description will be given of operation timing of the first plurality of switched capacitors 410.

Figure 8:
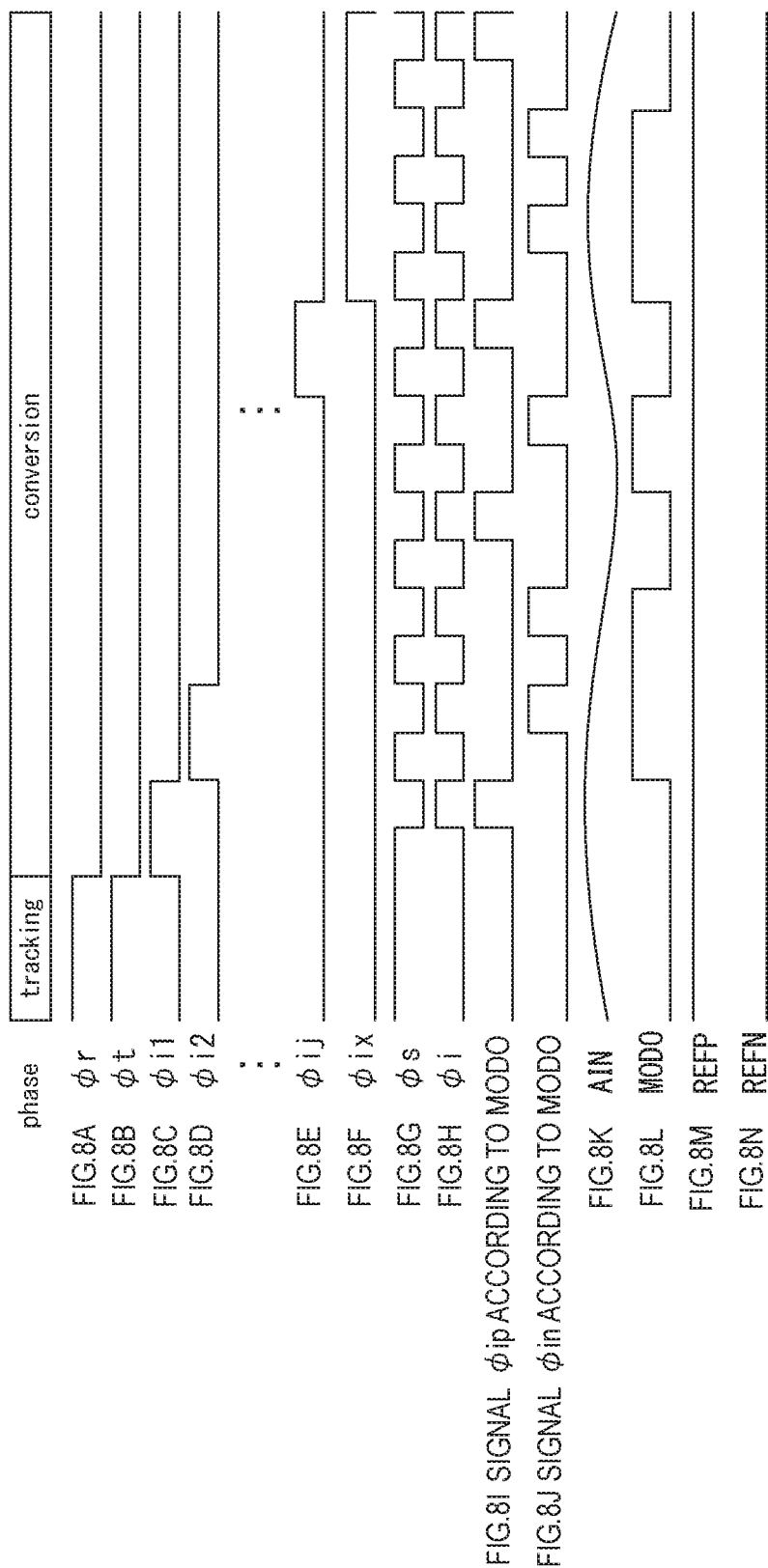
FIGS. 8A to 8N are signal waveform charts of the circuit illustrated in FIG. 7.

FIGS. 8A to 8N are signal waveform charts of the circuit illustrated in FIG. 7.

The first plurality of switched capacitors 410 transfer the electric charges stored in the capacitors Cs1p1 to Cs1pj and Cs1n1 to Cs1nj to the feedback capacitors at timing of rising of from $\phi$i1 to $\phi$ij from the first to the jth times in the conversion phase. However, the first plurality of switched capacitors 410 do not transfer the electric charges stored in the capacitors Cs1p1 to Cs1pj and Cs1n1 to Cs1nj to the feedback capacitors from the (j+1)th to the mth times.

The plurality of dummy switched capacitors 500 transfer the electric charges stored in the Cs1px and Cs1nx to the Ci1p and Ci1n at timing of rising of $\phi$ix at the (j+1)th time, and are put in a state of not being separated but being connected until an ending time of conversion.

In the second embodiment, since the load of the operational amplifier 411a is different between from the first to the jth times and from the (j+1)th to the mth times, the feedback band and the feedback gain of the operational amplifier 411a fluctuate.

On the other hand, in the third embodiment, by setting so that the Cs1p 1 to Cs1pj, the Cs1n1 to Cs1nj, the Cs1px, and Cs1nx have the same capacitance value, the load of the operational amplifier 411a can be maintained constant from the first to the jth times and from the (j+1)th to the mth times. Thereby, the feedback band and the feedback gain of the operational amplifier 411a during the conversion phase can be maintained constant. Thus, a band and a gain required of the operational amplifier 411a can be reduced, thus allowing reductions in current consumption and area.

Fourth Embodiment

Figure 9:
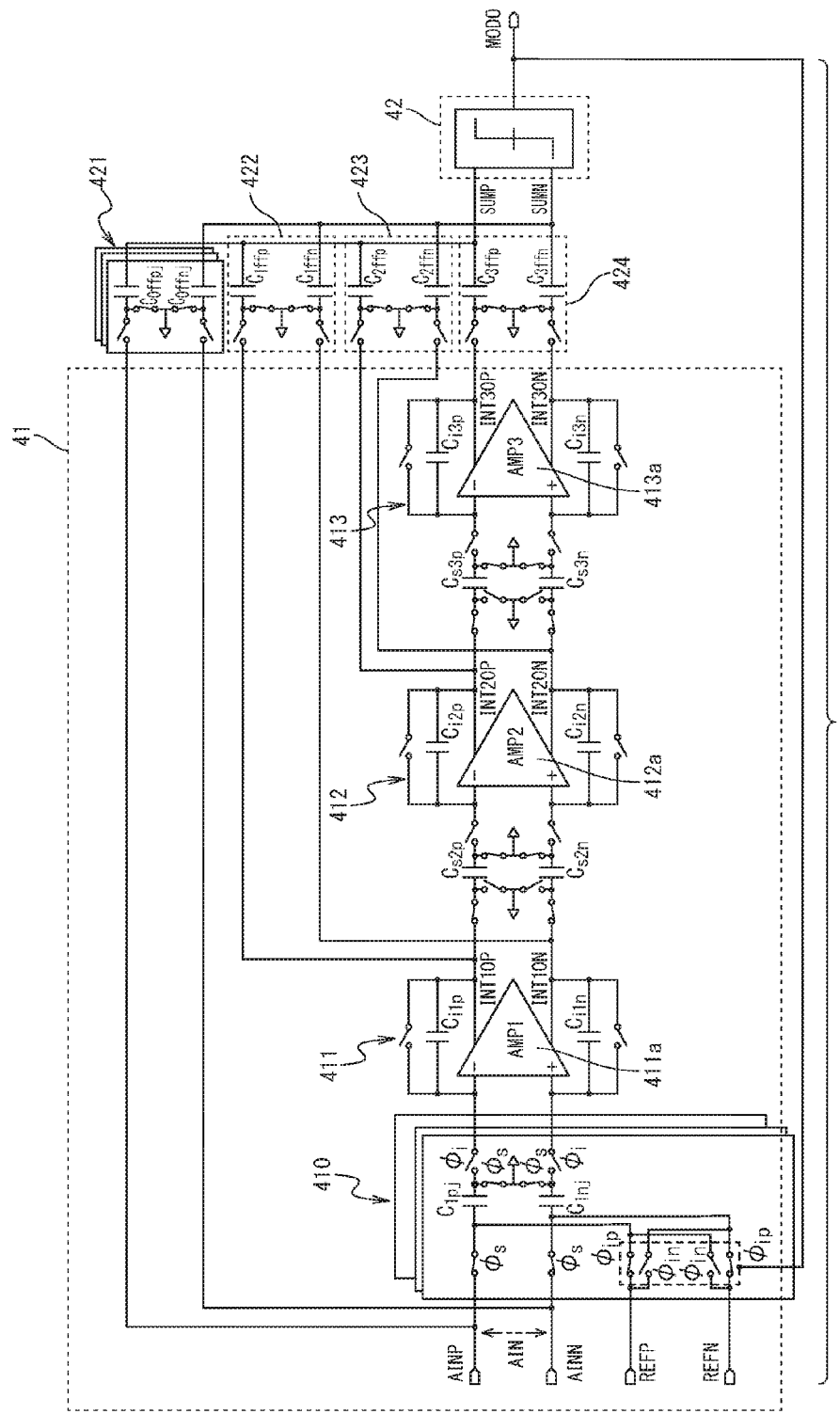
FIG. 9 is a circuit structure diagram illustrating an A/D converter according to a fourth embodiment of the invention.

FIG. 9 is a circuit structure diagram illustrating an A/D converter according to a fourth embodiment of the present invention.

The A/D converter of the fourth embodiment is different from the A/D converter of the first embodiment in that the capacitors included in the first plurality of switched capacitors 410 are connected not only to the AINP and the AINN but also to the REFP and the REFN.

In other words, the A/D converter of the fourth embodiment is different from the A/D converter of the first embodiment in that the first plurality of switched capacitors 410 and the D/A converter 414 share the capacitors. Structures other than that are the same as those of the A/D converter of the first embodiment.

Fifth Embodiment

Figure 10:
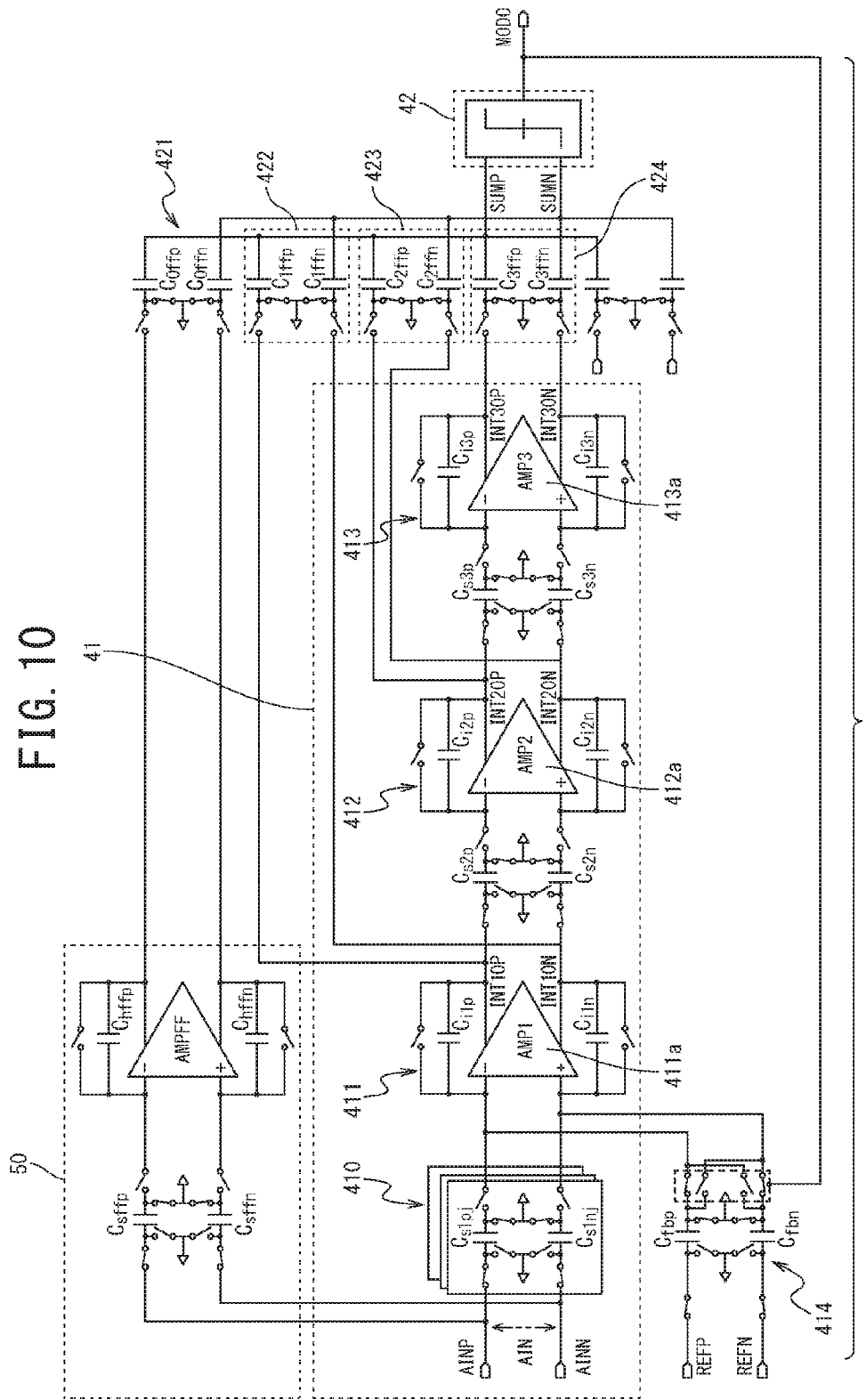
FIG. 10 is a circuit structure diagram illustrating an A/D converter according to a fifth embodiment of the invention.

FIG. 10 is a circuit structure diagram illustrating an A/D converter according to a fifth embodiment of the present invention.

The A/D converter of the fifth embodiment is, as compared to the A/D converter of the first embodiment, different in that the A/D converter includes a sample hold circuit 50 to which input signals AINP and AINN are input, and the first plurality of feedforward switched capacitors 421 are configured to transfer outputs of the sample hold circuit 50 to the quantizer.

The outputs of the sample hold circuit 50 are input to the capacitors C0ffp and C0ffn included in the first plurality of feedforward switched capacitors 421.

Meanwhile, when the incremental delta-sigma A/D modulator is a multibit modulator, a plurality of quantizers are required. At a quantization level of Q, the first plurality of feedforward switched capacitors 421 require Q×m capacitors to which a positive polarity signal is input and Q×m capacitors to which a negative polarity signal is input, thus increasing the capacitances of the first plurality of feedforward switched capacitors 421.

Accordingly, the fifth embodiment suppresses the number of the capacitors included in the first plurality of feedforward switched capacitors 421 by incorporating the sample hold circuit 50, thereby suppressing increases in the capacitances of the first plurality of feedforward switched capacitors 421.

The sample hold circuit 50 includes a switched capacitor 51 connected to the input signals AINP and AINN, an operational amplifier 52 whose input is connected to the switched capacitor 51, and feedback capacitors Chffp and Chffn connected to the input and an output of the operational amplifier 52. The switched capacitor 51 includes a capacitor Csffp to which the input signal AINP is input and a capacitor Csffn to which the input signal AINN is input.

In addition, although the incorporation of the sample hold circuit increases the number of elements, a feedforward unit in the incremental delta-sigma A/D modulator typically does not require high precision, so that power consumption and area are not increased so much.

With such a structure, the total value of input capacitances of the incremental delta-sigma A/D modulator becomes small, which thus can reduce performances (band and power consumption) required of a front stage driver of the incremental delta-sigma A/D modulator used to drive the input capacitances. Additionally, area reduction can also be made.

While some embodiments of the present invention have been described hereinabove, the technical scope of the invention is not limited to the technical scope described in the above embodiments. It is obvious from the description of the claims that various changes and improvements can be added to the above embodiments and such embodiments subjected to changes and improvements can also be included in the technical scope of the invention.

REFERENCE SIGNS LIST

1: Sample hold (SH) circuit
2: Reset signal generator
3: Delta-sigma modulator
4: Digital operation unit
11: Adder
12: Analog integrator
13: Quantizer
14: D/A converter (DAC)
40: Incremental delta-sigma A/D modulator
41: Analog integrator
42: Quantizer
43: Digital operation unit
44: Reset signal output device
50: Sample hold unit
410: First plurality of switched capacitors
411: First analog integrator
411a: First operational amplifier
412: Second analog integrator
412a: Second operational amplifier
413: Third analog integrator
413a: Third operational amplifier
414: Switched capacitor D/A converter
421: First plurality of feedforward switched capacitors
422: Second plurality of feedforward switched capacitors
423: Third plurality of feedforward switched capacitors
424: Fourth plurality of feedforward switched capacitors
500: Plurality of dummy switched capacitors

The invention claimed is:

1. An incremental delta-sigma A/D modulator comprising:
   an analog integrator configured to integrate input signals;
   a quantizer configured to quantize output signals of the analog integrator;
   a D/A converter configured to D/A convert based on an output of the quantizer; and
   a reset signal output device configured to output a reset signal for resetting the analog integrator, the incremental delta-sigma A/D modulator operating at a predetermined oversampling ratio, wherein the analog integrator includes a first plurality of switched capacitors, an operational amplifier connected to the first plurality of switched capacitors, and a feedback capacitor connecting an input and an output of the operational amplifier;

respective identical signals are input to respective corresponding switched capacitors of the first plurality of switched capacitors, and the first plurality of switched capacitors are configured to sequentially transfer electric charges stored in the respective switched capacitors to the feedback capacitor at each oversampling of the incremental delta-sigma A/D modulator.

2. The incremental delta-sigma A/D modulator according to claim 1, wherein the number of the switched capacitors included in the first plurality of switched capacitors is smaller than a value of the oversampling ratio of the incremental delta-sigma A/D modulator.

3. The incremental delta-sigma A/D modulator according to claim 2, further comprising a plurality of dummy switched capacitors, the plurality of dummy switched capacitors including a plurality of dummy capacitors to which an identical signal is input, wherein after the electric charges stored in the respective switched capacitors of the first plurality of switched capacitors are transferred to the feedback capacitor, the plurality of dummy switched capacitors connect the plurality of dummy capacitors to an inverting input and a non-inverting input of the operational amplifier.

4. The incremental delta-sigma A/D modulator according to claim 3, wherein the plurality of dummy switched capacitors connect the plurality of dummy capacitors to the inverting input and the non-inverting input of the operational amplifier for a period of time in which the incremental delta-sigma A/D modulator performs a plurality of oversampling operations.

5. The incremental delta-sigma A/D modulator according to claim 1, wherein the number of the switched capacitors included in the first plurality of switched capacitors is the same as a value of the oversampling ratio of the incremental delta-sigma A/D modulator.

6. The incremental delta-sigma A/D modulator according to claim 1, further comprising a first plurality of feedforward switched capacitors to which signals identical to the signals input to the first plurality of switched capacitors are input.

7. The incremental delta-sigma A/D modulator according to claim 1, further comprising a sample hold circuit to which signals identical to the signals input to the first plurality of switched capacitors are input; and a first plurality of feedforward switched capacitors to which outputs of the sample hold circuit are input.

8. The incremental delta-sigma A/D modulator according to claim 7, wherein outputs of the first plurality of feedforward switched capacitors are input to the quantizer.

9. An A/D converter comprising the incremental delta-sigma A/D modulator according to claim 1 and a digital operation unit to which an output signal of the incremental delta-sigma A/D modulator is input, wherein the digital operation unit includes a digital amplifier configured to amplify the input signal.

10. The A/D converter according to claim 9, wherein the digital operation unit further includes a digital integrator configured to integrate the input signal.

* * * * *